(12) United States Patent
Liu

(10) Patent No.: US 12,204,214 B2
(45) Date of Patent: Jan. 21, 2025

(54) ARRAY SUBSTRATE AND LIQUID CRYSTAL DISPLAY PANEL

(71) Applicant: TCL China Star Optoelectronics Technology Co., Ltd., Shenzhen (CN)

(72) Inventor: Jinming Liu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 18/192,675

(22) Filed: Mar. 30, 2023

(65) Prior Publication Data

US 2024/0210771 A1    Jun. 27, 2024

(30) Foreign Application Priority Data

Dec. 27, 2022  (CN) .......................... 202211689670.X

(51) Int. Cl.
*G02F 1/1362*   (2006.01)
*G02F 1/1343*   (2006.01)
*H01L 27/12*    (2006.01)

(52) U.S. Cl.
CPC .. *G02F 1/136218* (2021.01); *G02F 1/134309* (2013.01); *G02F 1/13439* (2013.01); *G02F 1/136286* (2013.01); *H01L 27/124* (2013.01); *G02F 2201/123* (2013.01); *G02F 2201/40* (2013.01)

(58) Field of Classification Search
CPC ......... G02F 1/136218; G02F 1/134309; G02F 1/13439; G02F 1/136286
See application file for complete search history.

(56) References Cited

U.S. PATENT DOCUMENTS

2013/0057813 A1*  3/2013  Jeong ................ G02F 1/134309
                                            349/110

* cited by examiner

*Primary Examiner* — Lucy P Chien
(74) *Attorney, Agent, or Firm* — Nathan & Associates; Menachem Nathan

(57) ABSTRACT

An array substrate and a liquid crystal display panel are provided. A shielding electrode is at least arranged between a data line and a pixel electrode. On a base substrate, an orthogonal projection of the shielding electrode and an orthogonal projection of the data line both overlap with an orthogonal projection of a portion of a trunk electrode extending along a direction of a data line, so that the shielding electrode shields a coupling effect between the data line and the pixel electrode. By arranging the data line and the shielding electrode in an area corresponding to the trunk electrode of a pixel electrode, less space or no space are occupied by the shielding electrode and the data line. The present application increases an aperture ratio of the pixel and increases a transmittance of the display panel.

18 Claims, 7 Drawing Sheets

ARRAY SUBSTRATE AND LIQUID CRYSTAL DISPLAY PANEL

FIELD OF DISCLOSURE

The present application relates to a field of display technology and in particular, to an array substrate and a liquid crystal display panel.

DESCRIPTION OF RELATED ART

Liquid crystal display devices are widely used due to the advantages of high image quality, low power consumption, and low cost. In conventional liquid crystal display devices, pixels are designed as a multi-domain structure such as 8 domains or 4 domains, so as to improve the display effect. Further, in order to reduce the influence of a coupling effect between a data line and a pixel electrode, a shielding line is provided to shield data signals. Specifically, in the pixel design, the data lines and the shielding lines are arranged on both sides of the pixels. However, since the shielding lines and the data lines are opaque, an aperture ratio of the pixel is low, which in turn leads to a low transmittance of the display panel.

As a result, the conventional liquid crystal display devices have the technical problems that space on both sides of the pixel is occupied by the shielding electrode line and the data line, leading to a low aperture ratio of the pixel.

SUMMARY

The present application provides an array substrate and a liquid crystal display panel for alleviating technical problems of low aperture ratios of pixels caused by shielding lines and data lines occupying space on both sides of the pixels in conventional liquid crystal display devices.

The present application provides an array substrate, including:

a base substrate;

a first metal layer disposed on one side of the base substrate;

a second metal layer disposed at one side of the first metal layer away from the base substrate, the second metal layer including a plurality of data lines; and a pixel electrode layer disposed at one side of the second metal layer away from the first metal layer, the pixel electrode layer including a plurality of pixel electrodes;

wherein each of the pixel electrodes includes a trunk electrode and a branch electrode, and the array substrate further includes a plurality of shielding electrodes;

wherein each of the shielding electrodes is at least disposed between one of the data lines and one of the pixel electrodes, in which a portion of the trunk electrode of the pixel electrode extends along a direction of the data line; and an orthogonal projection of the shielding electrode on the base substrate overlaps with an orthogonal projection of the portion of the trunk electrode extending along the direction of the data line, and an orthogonal projection of the data line overlaps with the orthogonal projection of the portion of the trunk electrode extending along the direction of the data line.

In some embodiments, each of the shielding electrodes includes a transparent electrode, an orthogonal projection of each shielding electrode projected on the base substrate covers orthogonal projections of each two adjacent pixel electrodes projected on the base substrate, and the orthogonal projection of each shielding electrode projected on the base substrate covers a gap between the orthogonal projections of each two adjacent pixel electrodes projected on the base substrate.

In some embodiments, each of the shielding electrodes includes a transparent electrode; and in an area corresponding to a gap between each two adjacent pixel electrodes, two adjacent shielding electrodes are partially connected to each other and partially disconnected from each other, and an orthogonal projection of each shielding electrode projected on the base substrate partially overlaps with an orthogonal projection of the corresponding pixel electrode projected on the base substrate.

In some embodiments, the array substrate includes a plurality of shielding electrodes, the shielding electrodes are arranged corresponding to the pixel electrodes, and the shielding electrodes disposed in an area corresponding to two adjacent pixel electrodes are electrically insulated from each other.

In some embodiments, on a plane where the second metal layer is located, along a direction perpendicular to the data line, an orthogonal projection of each shielding electrode projected on the base substrate is located within a boundary of an orthogonal projection of the corresponding pixel electrode projected on the base substrate.

In some embodiments, the array substrate further includes a shielding electrode layer, the shielding electrode layer is disposed between the second metal layer and the pixel electrode layer, and the shielding electrode layer includes the plurality of shielding electrodes.

In some embodiments, a material of the shielding electrode includes at least one of indium tin oxide, indium zinc oxide, or indium gallium zinc oxide.

In some embodiments, the first metal layer includes a common line, an orthogonal projection of the common line projected on the base substrate is perpendicular to an orthogonal projection of each of the data lines projected on the base substrate, and the common line is connected to the shielding electrodes.

In some embodiments, an orthogonal projection of at least one shielding electrode projected on the base substrate overlaps with the orthogonal projection of the common line projected on the base substrate; and in an area where the orthogonal projection of the at least one shielding electrode projected on the base substrate overlaps with the orthogonal projection of the common line projected on the base substrate, the plurality of shielding electrodes are connected to the common line.

The present application further provides a liquid crystal display panel. The liquid crystal display panel includes the array substrate mentioned above, a color filter substrate, and a liquid crystal layer disposed between the array substrate and the color filter substrate.

Advantages of the Present Application

The present application provides an array substrate and a liquid crystal display panel. The array substrate includes a base substrate, a first metal layer, a second metal layer, and a pixel electrode layer. The first metal layer is disposed on one side of the base substrate. The second metal layer is disposed at one side of the first metal layer away from the base substrate. The second metal layer includes a plurality of data lines. The pixel electrode layer is disposed at one side of the second metal layer away from the first metal layer. The pixel electrode layer includes a plurality of pixel electrodes. Each of the pixel electrodes includes a trunk electrode and a branch electrode. The array substrate further includes a plurality of shielding electrodes. Each of the shielding electrodes is at least disposed between one of the data lines and one of the pixel electrodes, in which a portion of the trunk electrode of the pixel electrode extends along a direction of the data line, and on the base substrate, an orthogonal projection of the shielding electrode overlaps with an orthogonal projection of the portion of the trunk electrode extending along the direction of the data line, and an orthogonal projection of the data line overlaps with the orthogonal projection of the portion of the trunk electrode extending along the direction of the data line. Accordingly, the shielding electrode can shield a coupling effect between the data line and the pixel electrode. Also, by arranging the data lines and the shielding electrodes in an area corresponding to the trunk electrodes of the pixel electrodes, the shielding electrodes and the data lines can occupy less space or even no space at all, thus increasing an aperture ratio of the pixel and improving a transmittance of the display panel.

BRIEF DESCRIPTION OF DRAWINGS

The technical solutions and other advantages of the present application will be made clear in the following description made in connection with the accompanying drawings and with reference to specific embodiments.

DETAILED DESCRIPTION OF EMBODIMENTS

The technical solutions of the present application are clearly and completely described below in conjunction with the accompanying drawings and with reference to specific embodiments. Certainly, the described embodiments are only some of the embodiments of this application, not all of them. Based on the embodiments in the present application, all other embodiments obtained by those skilled in the art without creative effort should be deemed to fall within the protection scope of the present application.

Figure 1:
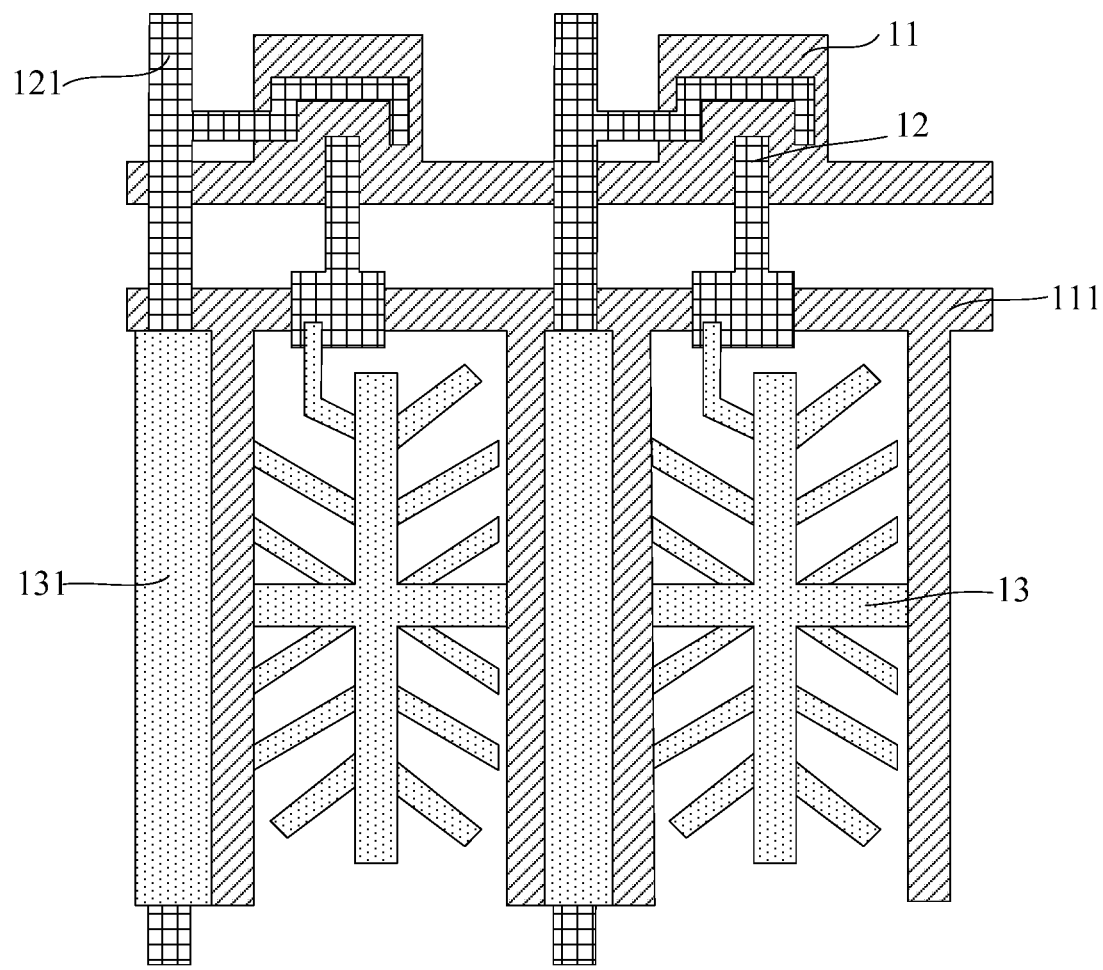
FIG. 1 is a schematic view of a conventional liquid crystal display device.

As shown in FIG. 1, a conventional liquid crystal display device includes a gate layer 11, a source-drain layer 12 and a pixel electrode layer 13. In order to improve display performance of the conventional liquid crystal display device, a pixel is designed as a multi-domain structure (with 4 domains as an example). Further, in order to reduce a coupling effect between a data line 121 and a pixel electrode, a shielding line 131 is disposed on the pixel electrode layer 13 to shield the data line 121 and the pixel electrode from the coupling effect. However, as shown in FIG. 1, the data lines 121 and the shielding lines 131 are arranged on two sides of the pixel, and the data lines 121 and the shielding lines 131 are opaque, resulting in a low aperture ratio of the pixel. Moreover, in the pixel, a common line 111 is provided on the gate layer 11 for shielding signals, but the common line 111 is opaque, which further reduces the aperture ratio of the pixel. Therefore, in the conventional liquid crystal display device the pixel has a low aperture ratio because the shielding lines, the data lines, and other lines occupy space on two sides of the pixel.

In solution, the present application provides an array substrate and a liquid crystal display panel to alleviate the above-mentioned technical problems.

Figure 2:
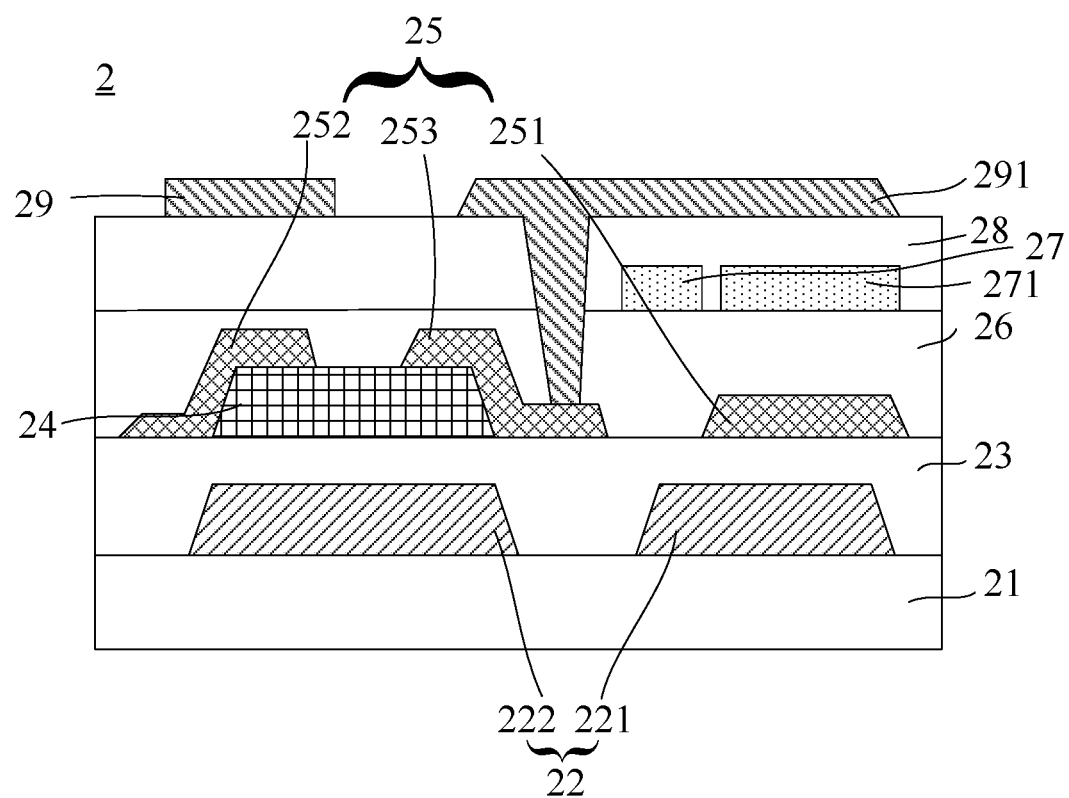
FIG. 2 is a first schematic view of an array substrate according to one embodiment of the present application.
Figure 3:
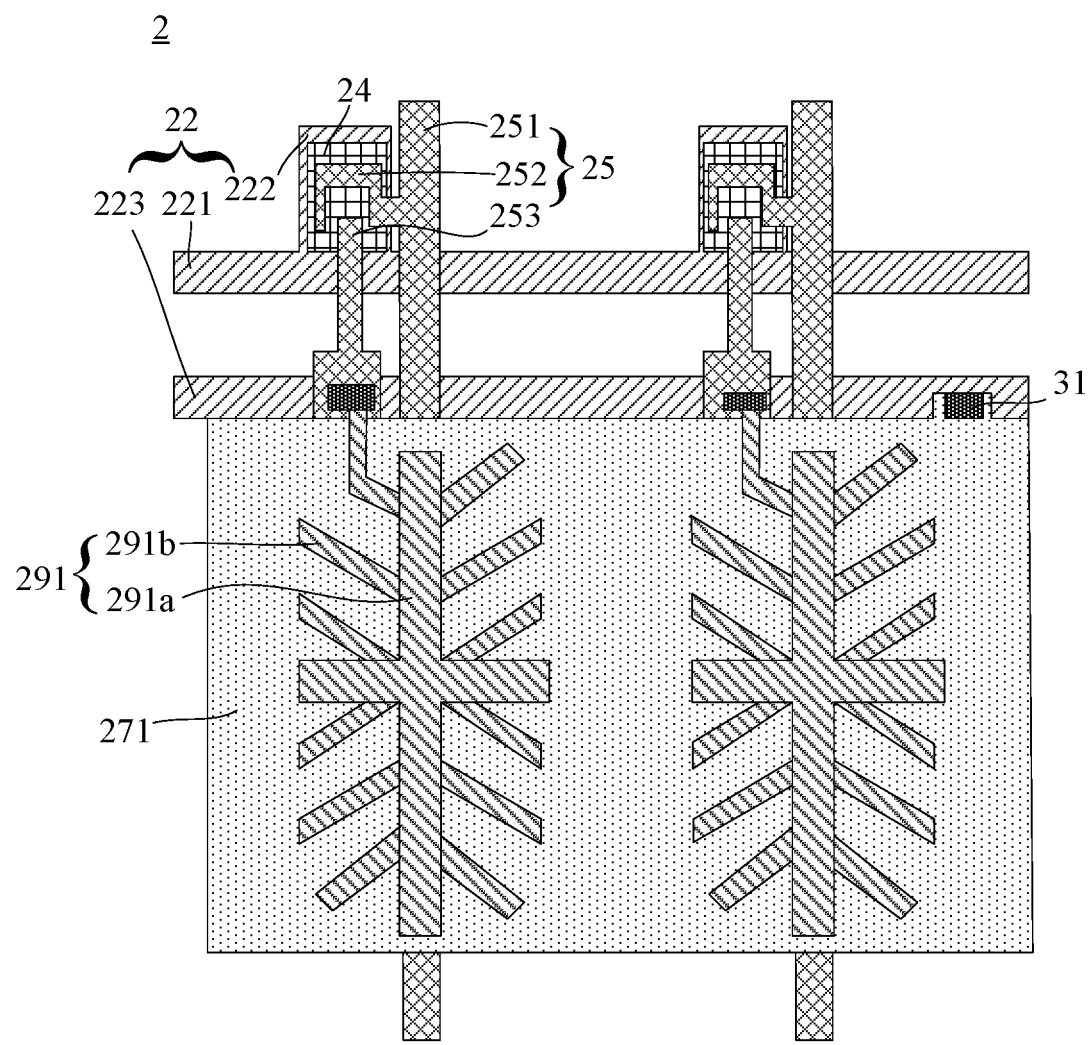
FIG. 3 is a second schematic view of the array substrate according to one embodiment of the present application.
Figure 4:
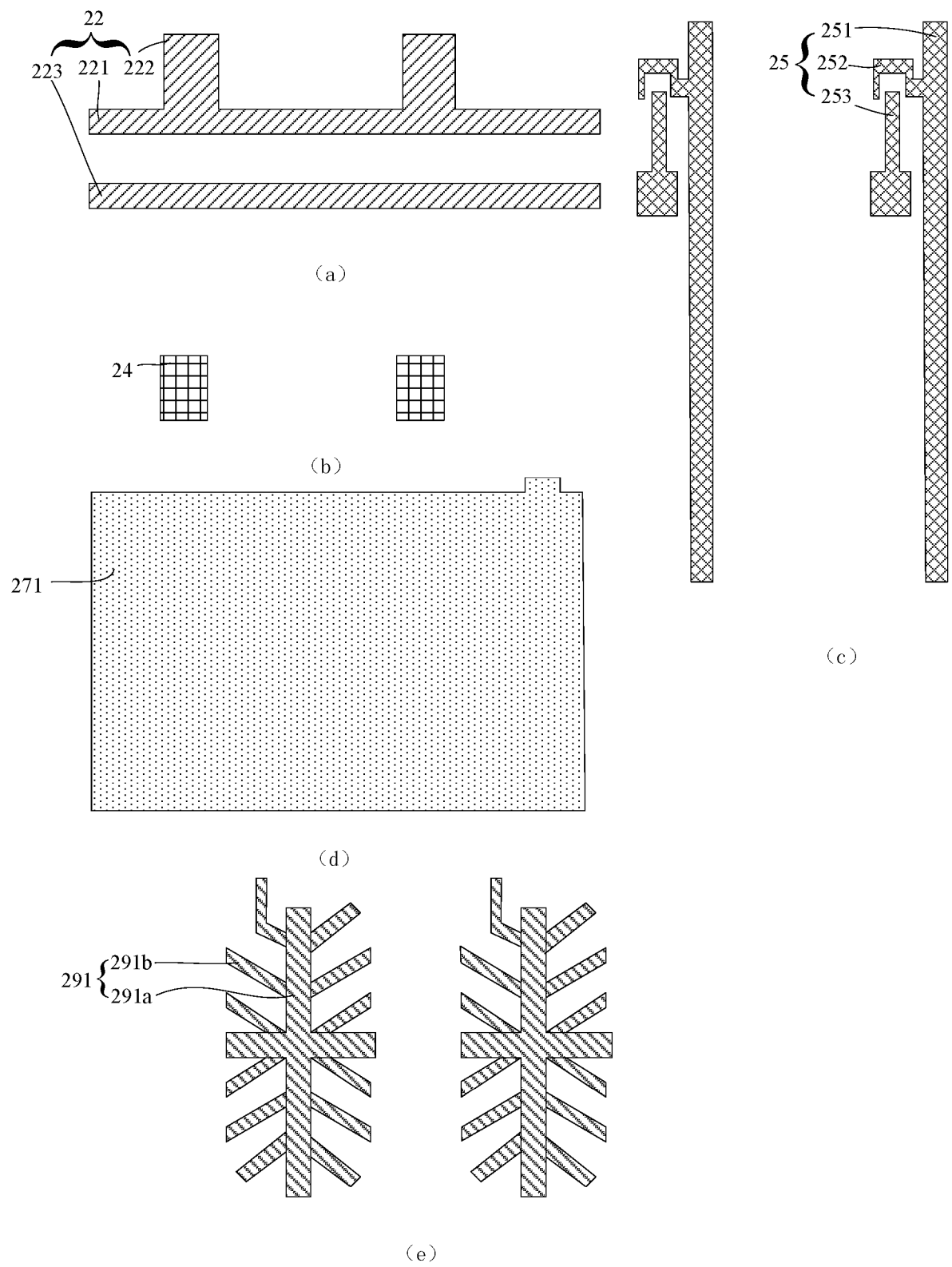
FIG. 4 is an exploded view illustrating various layers of the array substrate in FIG. 3.
Figure 5:
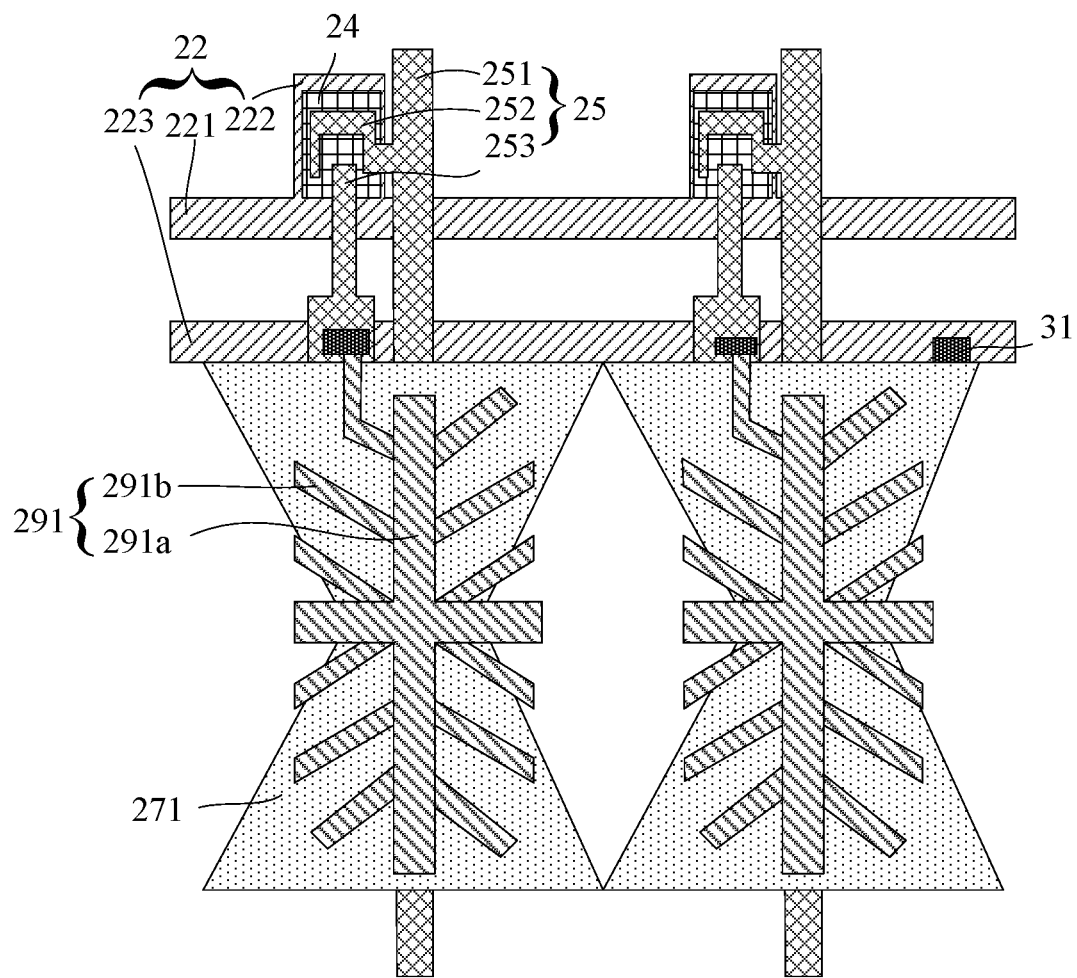
FIG. 5 is a third schematic view of the array substrate according to one embodiment of the present application.
Figure 6:
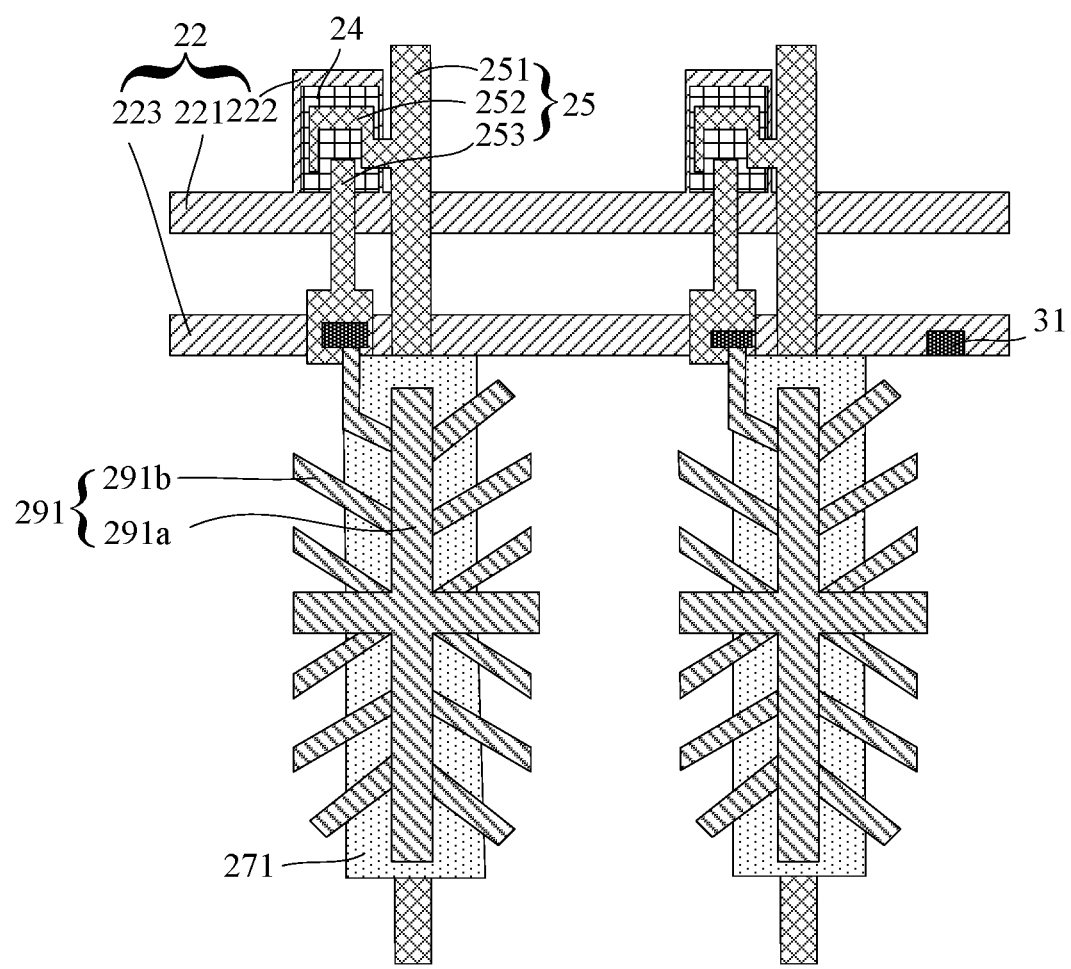
FIG. 6 is a fourth schematic view of the array substrate according to one embodiment of the present application.

FIG. 2 is a first schematic view illustrating an array substrate according to one embodiment of the present application. FIG. 3 is a second schematic view of the array substrate according to one embodiment of the present application. FIG. 4 is an exploded view illustrating layers of the array substrate in FIG. 3, in which (a) in FIG. 4 is a first metal layer of the array substrate in the exploded view of FIG. 3, (b) in FIG. 4 is an active layer of the array substrate in the exploded view of FIG. 3, (c) in FIG. 4 is a second metal layer of the array substrate in the exploded view of FIG. 3; (d) in FIG. 4 is a shielding electrode of the array substrate in the exploded view of FIG. 3; (e) in FIG. 4 is a pixel electrode of the array substrate in the exploded view of FIG. 3. FIG. 5 is a third schematic view of the array substrate according to one embodiment of the present application. FIG. 6 is a fourth schematic view of the array substrate according to one embodiment of the present application.

Referring to FIGS. 2 to 4, the present application provides an array substrate 2. The array substrate 2 includes:

a base substrate 21;

a first metal layer 22 disposed on one side of the base substrate 21;

a second metal layer 25 disposed at one side of the first metal layer 22 away from the base substrate 21, the second metal layer 25 including a plurality of data lines 251; and a pixel electrode layer 29 disposed at one side of the second metal layer 25 away from the first metal layer 22, the pixel electrode layer 29 including a plurality of pixel electrodes 291;

wherein each of the pixel electrodes 291 includes a trunk electrode 291a and a branch electrode 291b, and the array substrate 2 further includes a plurality of shielding electrodes 271;

wherein each of the shielding electrodes 271 is at least disposed between one of the data lines 251 and one of the pixel electrodes 291, in which a portion of the trunk electrode 291a of the pixel electrode 291 extends along a direction of the data line 251, and on the base substrate 21, an orthogonal projection of the shielding electrode 271 overlaps with an orthogonal projection of the portion of the trunk electrode 291a extending along the direction of the data line 251, and an orthogonal projection of the data line 251 overlaps with the orthogonal projection of the trunk electrode 291a extending along the direction of the data line 251.

The present application provides an array substrate. The array substrate is provided with a plurality of shielding electrodes, so that each shielding electrode is at least disposed between one data line and one pixel electrode, wherein an orthogonal projection of the shielding electrode projected on the base substrate overlaps with an orthogonal projection of the trunk electrode projected on the base substrate, and an orthogonal projection of the data line projected on the base substrate overlaps with the orthogonal projection of the trunk electrode projected on the base substrate. As a result, the shielding electrodes can shield the data lines and the pixel electrodes from a coupling effect therebetween. Further, by arranging the data line and the shielding electrode in an area corresponding to the trunk electrode of the pixel electrode, the shielding electrodes and the data lines occupy less space or even no space, thereby increasing an aperture ratio of the pixel and improving a transmittance of the display panel.

Taking the array substrate shown in FIG. 3 as an example, the pixel electrode in FIG. 3 is designed to have 4 domains. The trunk electrode 291a includes a portion arranged horizontally and a portion arranged vertically (longitudinally), while the data lines 251 in FIG. 3 are arranged vertically. It can be understood that the portion of the trunk electrode 291a extending along the direction of the data line is the portion of the trunk electrode 291a arranged vertically.

Specifically, in order to solve a problem in conventional techniques that a data line occupy an aperture of a pixel because the data line overlaps a portion of a trunk electrode arranged along a direction of a scan line, the present application is designed such that on the base substrate, the orthogonal projection of the data line on the base substrate overlaps with the orthogonal projection of the portion of the trunk electrode extending along the direction of the data line. This way, the data line can be disposed in an area corresponding to the trunk electrode without occupying an aperture area of the pixel, thus reducing space occupied by the data lines and increasing the aperture ratio of the pixel. Further, the shielding electrode is arranged between the data line and the pixel electrode, and the orthogonal projection of the shielding electrode projected on the base substrate overlaps with the portion of the trunk electrode extending along the direction of the data line. As a result, the shielding electrode can shield the data line and the pixel electrode from a coupling effect therebetween. The present invention prevents the display performance from being affected by the coupling effect between the data line and the pixel electrode. The present invention reduces space occupied by the shielding electrode and improves the transmittance of the display panel while shielding the data line and the pixel electrode from the coupling effect therebetween.

In one embodiment, as shown in FIG. 3 and FIG. 4, the shielding electrode 271 includes a transparent electrode. The orthogonal projection of each shielding electrode 271 projected on the base substrate 21 covers the orthogonal projections of two adjacent pixel electrodes 291 projected on the base substrate 21. The orthogonal projection of each shielding electrode 271 projected on the base substrate 21 covers a gap between the orthogonal projections of two adjacent pixel electrodes 291 projected on the base substrate 21. By making the shielding electrode a transparent electrode, the shielding electrode can be arranged as an entire plane, so that the orthogonal projection of each shielding electrode projected on the base substrate can cover the orthogonal projections of two adjacent pixel electrode projected on the base substrate and the gap between the orthogonal projections of two adjacent pixel electrode projected on the base substrate. By forming the shielding electrode, the coupling effect between the data line and the pixel electrode can be prevented, and a storage capacitance formed by the shielding electrode and the pixel electrode can be increased. Accordingly, the present invention effectively alleviates problems such as longitudinal crosstalk and improves the display performance, and the shielding electrode does not take up space, thus increasing the aperture ratio of the pixel and improving the transmittance of the display panel.

Specifically, as shown in FIG. 3 and FIG. 4, the shielding electrode 271 is arranged such that the shielding electrode 271 is disposed corresponding to the gap between the pixel electrodes, thereby increasing a storage capacitance formed between the shielding electrode and the pixel electrode. Further, there is a distance between the orthogonal projection of the shielding electrode projected on the base substrate and an orthogonal projection of a scan line projected on the base substrate, thereby preventing the shielding electrode from affecting signals of the scan line. Moreover, the shielding electrode can be obtained by directly removing an electrode outside the gap between the pixel electrodes, which is a relatively simple process, and improves the manufacturing efficiency of the array substrate.

When the shielding electrode is arranged as an entire plane, a load of the array substrate is relatively large, which leads to a technical problem of low charging rate. As shown in FIG. 5, the shielding electrode 271 includes a transparent electrode. In an area corresponding to a gap between the adjacent pixel electrodes 291, the adjacent shielding electrodes 271 are connected in some areas, and the adjacent shielding electrodes 271 are disconnected in some areas, the orthogonal projections of the shielding electrodes 271 projected on the base substrate partially overlaps with the orthogonal projections of the pixel electrodes 291 projected on the base substrate. By making the two shielding electrodes partially connected and partially disconnected in the area corresponding to the gap between the adjacent pixel electrodes, the orthogonal projections of the shielding electrodes projected on the base substrate overlaps with the orthogonal projections of the pixel electrodes projected on the base substrate, thus reducing a capacitance formed between the shielding electrode and the pixel electrode, reducing the load of the array substrate. Moreover, an electric field in an area with the shielding electrode is different from an electric field in an area without the shielding electrode, and therefore, in the display panel, liquid crystals in the same pixel have different rotation angles, which leads to improved viewing angles of the display panel.

Specifically, as shown in FIG. 5, the adjacent shielding electrodes 271 are connected at upper and lower areas, and the adjacent shielding electrodes are disconnected in a middle area, so the adjacent shielding electrodes 271 can still be input the same signal through one end, thereby reducing the number of bonding terminals and the number of via holes, reducing the risk of display failures/problems. Further, the adjacent shielding electrodes are disconnected in the middle area, and the gap between the adjacent shielding electrodes in FIG. 5 are diamond-shaped. As a result, in the shielding electrode, a portion of the shielding electrode corresponds to the pixel electrodes, but a portion (i.e., areas where no shielding electrode is provided under the pixel electrodes in FIG. 5) of the shielding electrodes does not correspond to the pixel electrodes. Hence, in the pixel electrode, an electric field corresponding to an area where the shielding electrode is provided is different from an electric field corresponding to an area where no shielding electrode is provided, so that rotation angles of liquid crystals in the display panel are different, and viewing angles of the display panel improve. Moreover, compared with having the shielding electrode configured to have an entire plane, a capacitance is reduced by overlapping on the base substrate the orthogonal projections of the shielding electrodes with the orthogonal projections of the pixel electrodes, thereby reducing a driving load. Due to the fact that the shielding electrode still blocks light even though the shielding electrode is a transparent electrode, the transmittance of the display panel can be improved by reducing an overlapping area of the orthogonal projection of the shielding electrode on the base substrate and the orthogonal projection of the pixel electrode on the base substrate.

Specifically, FIG. 5 illustrates an example in which the gap between adjacent shielding electrodes is diamond-shaped (rhombus-shaped); however, the present application is not limited in this regard. For example, the gap between adjacent shielding electrodes can be oval, or can have an irregular shape spliced from multiple different shapes.

The array substrate still has a larger load by having adjacent shielding electrodes connected. In one embodiment, as shown in FIG. 6, the array substrate 2 includes a plurality of shielding electrodes 271. The shielding electrodes 271 are arranged corresponding to the pixel electrodes 291, respectively. The adjacent shielding electrodes 271 arranged corresponding to the adjacent pixel electrodes 291 are electrically insulated from each other. By insulating from each other the adjacent shielding electrodes arranged corresponding to the adjacent pixel electrodes, the capacitance between the shielding electrode and the pixel electrode can be further reduced. As a result, the driving load of the array substrate can be reduced, and an electric field in an area where the shielding electrode is disposed is different from an electric field in an area where the shielding electrode is not disposed, so that the liquid crystals in the same pixel rotate by different angles, thereby improving the viewing angles. Moreover, since an area of the shielding electrode is reduced, the transmittance of the array substrate can be increased, and the transmittance of the display panel can be improved.

In one embodiment, as shown in FIG. 6, along a direction perpendicular to the direction of the data line 251, a widest width of the orthogonal projection of the shielding electrode 271 projected on the base substrate 21 is less than a shortest width of the orthogonal projection of the pixel electrode 291 projected on the base substrate 21. By making the widest width of the orthogonal projection of the shielding electrode projected on the base substrate be less than the shortest width of the orthogonal projection of the pixel electrode projected on the base substrate, the area of the shielding electrode is further reduced, and the overlapping area of the shielding electrode and the pixel electrode is reduced, so that the transmittance of the array substrate can be further improved, and the driving load of the array substrate can be further reduced. Further, because the shielding electrode partially overlaps with the pixel electrode, an electric field of the pixel electrode corresponding to an area with the shielding electrode is different from an electric field of the pixel electrode corresponding an area without the shielding electrode. As a result, liquid crystals in the display panel rotate by different angles, and viewing angles of the display panel are improved.

Specifically, as shown in FIG. 6, each pixel electrode 291 is disposed corresponding to a shielding electrode 271. The shielding electrode 271 is a rectangle, and a boundary of the rectangle is located within a boundary of the pixel electrode, so that a portion of the pixel electrode 291 is arranged face-to-face with the shielding electrode 271, and a portion of the pixel electrode 291 is not arranged corresponding to the shielding electrode 271 (that is, there is no shielding electrode 271 under this portion of the pixel electrode 291 as shown in FIG. 6). As a result, when the light passes through the shielding electrode and the pixel electrode, the transmittance of the array substrate is improved because some areas are not provided with the shielding electrodes 271. Compared to the case in which the shielding electrode is configured as an entire plane, the shielding electrode of the present embodiment has a smaller area, thus reducing a capacitance between the shielding electrode and the pixel electrode, and reducing a driving load of the array substrate. The shielding electrode is arranged corresponding (face-to-face) to only a portion of the pixel electrode, so an electric field in an area with the shielding electrode is different from an electric field without the shielding electrode, so that liquid crystals in the display panel rotate by different angles, and viewing angles of the display panel are improved.

Specifically, in FIG. 6, one single shielding electrode is rectangular-shaped as an example for illustration, but the present application is not limited thereto. For example, one single shielding electrode can be rhombus-shaped.

Specifically, the shielding electrode can be arranged such that, on the substrate, the orthogonal projection of the shielding electrode can also be located within the orthogonal projection of the portion of the trunk electrode extending along the direction of the data line. By arranging the shielding electrode in an area corresponding to the portion of the trunk electrode extending along the direction of the data line, the shielding electrode does not occupy the space of the aperture area in the pixel electrode, and the transmittance of the array substrate is improved. At the same time, the capacitance between the shielding electrode and the pixel electrodes is low, which reduces the load of the array substrate.

Specifically, the width of the shielding electrode is less than or equal to a width of the trunk electrode. By making the width of the shielding electrode less than or equal to the width of the trunk electrode, the shielding electrode can be arranged in an area corresponding to the trunk electrode, thereby preventing the shielding electrode from occupying the space of the aperture area in the pixel electrode, improving the transmittance of the array substrate, and reducing the load of the array substrate.

In one embodiment, a width of the data line is less than or equal to a width of the trunk electrode. By making the width of the data line less than or equal to the width of the trunk electrode, the data line can be arranged in an area corresponding to the trunk electrode. As a result, in an area of the pixel electrode, the data line does not occupy the aperture area of the pixel electrode, thus increasing the aperture ratio of the pixel.

Specifically, as shown in FIG. 3, it can be seen that the portion of the data line 251 disposed corresponding to the trunk electrode 291a is located under the trunk electrode 291a, so that the data line does not occupy the aperture area at two sides of the trunk electrode, thereby further improving the aperture ration of the pixel.

In one embodiment, as shown in FIG. 2, the array substrate 2 further includes a shielding electrode layer 27. The shielding electrode layer 27 is disposed between the second metal layer 25 and the pixel electrode layer 29. The shielding electrode layer 27 includes a plurality of shielding electrodes 271. Because the shielding electrode layer include the shielding electrodes, the space of other layers are not occupied when the shielding electrodes are arranged.

In one embodiment, a material of the shielding electrode includes at least one of indium tin oxide, indium zinc oxide, or indium gallium zinc oxide. The shielding electrode is made of one of transparent conductive materials, and therefore, even though the shielding electrode is arranged in the aperture area of the pixel electrode, the display panel can still display normally because the shielding electrode is made of a transparent conductive material. Accordingly, the orthogonal projection of the shielding electrode projected on the substrate can be larger than the orthogonal projection of the data line projected on the substrate, so that the shielding electrode can better shield the data line and the pixel electrode from a coupling effect therebetween.

Specifically, the above embodiments describe the example in which the shielding electrodes are disposed in the shielding electrode layer. However, the embodiments of the present application are not limited in this regard. For example, when there is a conductive layer between the data line and the pixel electrode layer, the conductive layer can be connected to the pixel electrode and the drain. In this case, the shielding electrode is not disposed in the aperture area of the pixel electrode, so the shielding electrode can be disposed in the conductive layer to avoid increasing a thickness of the array substrate; or alternatively, when the conductive layer is made of a transparent material, the shielding electrode can be disposed in the conductive layer.

In conventional techniques, there is a problem a low transmittance of the display panel resulting from common lines arranged at two sides of the sub-pixel. In one embodiment, as shown in FIG. 3 and FIG. 4, the first metal layer 22 includes a common line 223, and an orthogonal projection of the common line 223 projected on the substrate is perpendicular to the orthogonal projection of the data line 251 projected on the substrate, and the common line 223 is connected to the shielding electrode 271. The orthogonal projection of the common line projected on the substrate is perpendicular to the orthogonal projection of the data line projected on the substrate, and the common line is connected to the shielding electrode, so the shielding electrode can transmit signals of the common line. Accordingly, common lines at two sides of the sub-pixel can be removed, and only the common line located at an upper side of the sub-pixel is reserved, so the aperture ratio of the pixel is further increased, and the transmittance of the display panel improves.

Specifically, as shown in FIG. 3, in configuring the common line 223, the common line 223 does not need to be arranged at two sides of the pixel electrode, and the common wiring 223 is arranged perpendicular to the data line, thereby improving the transmittance of the display panel. Further, the common line is connected to the shielding electrode, so the shielding electrode can transmit the signals of the common line, and the array substrate can work normally.

In one embodiment, as shown in FIG. 3 and FIG. 4, the orthogonal projection of at least one shielding electrode 271 projected on the substrate overlaps with the orthogonal projection of the common line 223 projected on the substrate. In an area where the orthogonal projection of the at least one shielding electrode 271 projected on the substrate overlaps with the orthogonal projection of the common line 223 projected on the substrate, and the at least one shielding electrode 271 is connected to the common line 223. The orthogonal projection of the shielding electrode projected on the substrate overlaps with the orthogonal projection of the common line projected on the substrate. Further, in the area where the orthogonal projection of the shielding electrode projected on the substrate overlaps with the orthogonal projection of the common line projected on the substrate, the shielding electrode is connected to the common line. Accordingly, the shielding electrode can be directly connected to the common line, without a need of making an electrical connection through other layers, and thereby the present application reduces manufacturing steps and improves the manufacture efficiency of the array substrate.

Specifically, as shown in FIG. 3, a position of a via hole is indicated by the reference numeral 31. In FIG. 3, the orthogonal projection of the shielding electrode projected on the substrate and the orthogonal projection of the common line projected on the substrate overlap with a via hole. The shielding electrode can be connected to the common line through a via hole. In this case, the via hole can be a through hole in the insulating layer between the shielding electrode and the common line. Taking FIG. 1 as an example, the via hole is a through hole extending through the first insulating layer 23 and the second insulating layer 26. In a position where the pixel electrode is connected to the drain, the via hole is a through hole of the insulating layer between the pixel electrode and the drain. Taking FIG. 1 as an example, the via hole is a through hole of the third insulating layer 28.

Specifically, when the shielding electrode is configured as an entire plane or when two adjacent shielding electrodes are partially connected, the shielding electrode can be connected to the common line, so that a potential of an entire surface of the shielding electrode is the same. When the adjacent shielding electrodes are disconnected, each shielding electrode is connected to the common line, and signals are input to respective corresponding shielding electrodes.

Specifically, the above embodiment is described by taking an example that the shielding electrode is connected to the common line. However, the present application is not limited in this regard. For example, the shielding electrodes can be connected to other signal lines at an edge of the array substrate.

In one embodiment, as shown in FIG. 2, the array substrate 2 further includes a first insulating layer 23, an active layer 24, a second insulating layer 26, and a third insulating layer 28. The first insulating layer 23 is disposed between the first metal layer 22 and the active layer 24. The second insulating layer 26 is disposed between the second metal layer 25 and the shielding electrode layer 27. The third insulating layer 28 is disposed between the shielding electrode layer 27 and the pixel electrode layer 29.

In one embodiment, as shown in FIG. 2, the first metal layer 22 further includes a scan line 221 and a gate 222.

In one embodiment, as shown in FIG. 2, the second metal layer 25 further includes a source 252 and a drain 253.

Specifically, FIG. 3 to FIG. 6 all show a corresponding area for two adjacent pixel electrodes. Structures of the layers of the array substrate in FIG. 5 and FIG. 6 can be referred to the layers' exploded view in FIG. 4.

Specifically, the above-mentioned embodiment is described by taking a 4-domain pixel structure as an example, but the present application is not limited thereto. For example, when the pixel structure is a 8-domain pixel structure or other multiple-domain pixel structure, the array substrate of the present application is suitable for such a pixel design.

Figure 7:
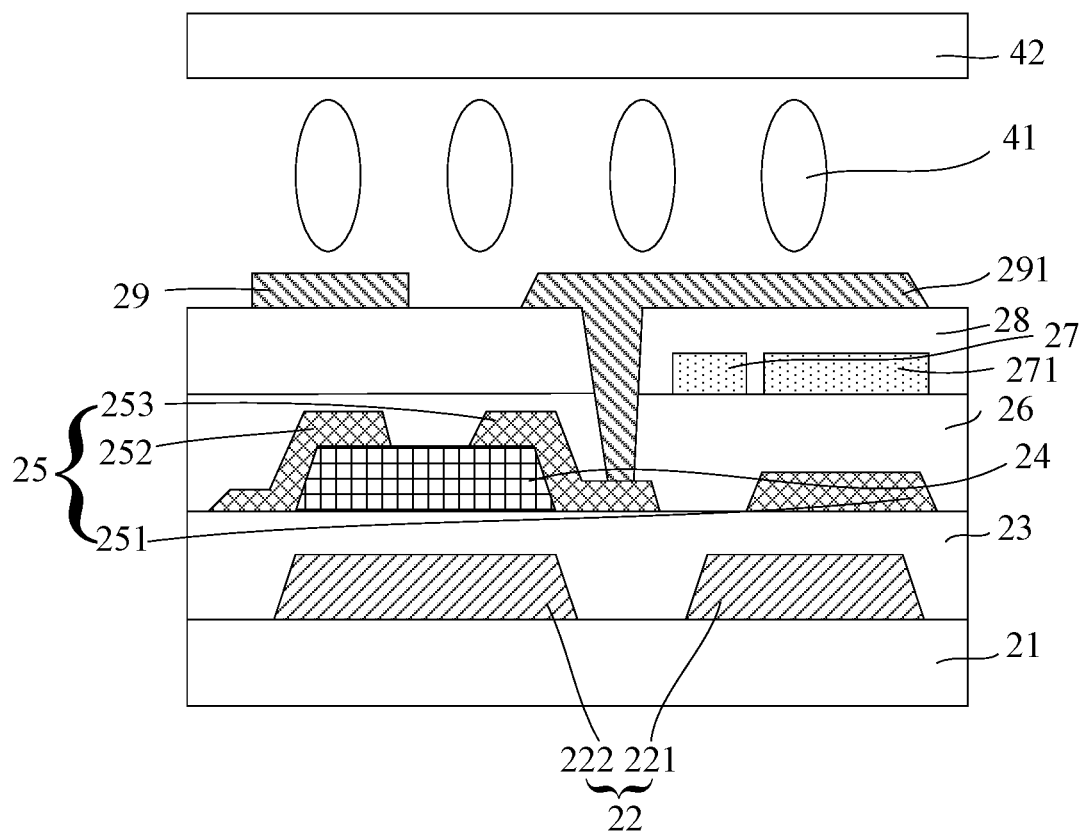
FIG. 7 is a schematic view of a liquid crystal display panel according to one embodiment of the present application.

Further, as shown in FIG. 7, the present application provides a liquid crystal display panel 4. The liquid crystal display panel 4 includes the array substrate as described in any of the above embodiments, a color filter substrate 42, and a liquid crystal layer disposed between the array substrate and the color filter substrate 42.

To summarize the above embodiments:

The present application provides an array substrate and a liquid crystal display panel. The array substrate includes a base substrate, a first metal layer, a second metal layer, and a pixel electrode layer. The first metal layer is disposed on one side of the base substrate. The second metal layer is disposed at one side of the first metal layer away from the base substrate. The second metal layer includes a plurality of data lines. The pixel electrode layer is disposed at one side of the second metal layer away from the first metal layer. The pixel electrode layer includes a plurality of pixel electrodes. Each of the pixel electrodes includes a trunk electrode and a branch electrode. The array substrate further includes a plurality of shielding electrodes. Each of the shielding electrodes is at least disposed between one of the data lines and one of the pixel electrodes, in which a portion of the trunk electrode of the pixel electrode extends along a direction of the data line, and on the base substrate, an orthogonal projection of the shielding electrode overlaps with an orthogonal projection of the portion of the trunk electrode extending along the direction of the data line, and an orthogonal projection of the data line overlaps with the orthogonal projection of the portion of the trunk electrode extending along the direction of the data line. Accordingly, the shielding electrode can shield a coupling effect between the data line and the pixel electrode. Also, by arranging the data lines and the shielding electrodes in an area corresponding to the trunk electrodes of the pixel electrodes, the shielding electrodes and the data lines can occupy less space or even do not occupy space, thus increasing an aperture ratio of the pixel and improving a transmittance of the display panel.

In the foregoing embodiments, each embodiment has its own emphasis. For those not described in detail in one certain embodiment, reference may be made to relevant descriptions of other embodiments.

The array substrate and the liquid crystal display panel of the present application are detailed as above. In the present disclosure, specific examples are used to illustrate the working principles and the embodiments of the present application. The description of the above embodiments is only provided for ease of understanding the technical solutions and the main ideas of the present invention. Those skilled in the art can still modify the technical solutions described in the foregoing embodiments or perform equivalent replacements for some of the technical features. Such modifications or replacements should fall within the protection scope of the present application.

What is claimed is:

1. An array substrate, comprising:
    a base substrate;
    a first metal layer disposed on one side of the base substrate;
    a second metal layer disposed at one side of the first metal layer away from the base substrate, the second metal layer comprising a plurality of data lines; and
    a pixel electrode layer disposed at one side of the second metal layer away from the first metal layer, the pixel electrode layer comprising a plurality of pixel electrodes;
    wherein each of the pixel electrodes comprises a trunk electrode and a branch electrode, and the array substrate further comprises a plurality of shielding electrodes;
    wherein each of the shielding electrodes is at least disposed between one of the data lines and one of the pixel electrodes, in which a portion of the trunk electrode of the pixel electrode extends along a direction of the data line, and on the base substrate, an orthogonal projection of the shielding electrode overlaps with an orthogonal projection of the portion of the trunk electrode extending along the direction of the data line, and an orthogonal projection of the data line overlaps with the orthogonal projection of the portion of the trunk electrode extending along the direction of the data line, wherein each of the shielding electrodes is a transparent shielding electrode.

2. The array substrate according to claim 1, wherein an orthogonal projection of each shielding electrode projected on the base substrate covers orthogonal projections of each two adjacent pixel electrodes projected on the base substrate, and the orthogonal projection of each shielding electrode projected on the base substrate covers a gap between the orthogonal projections of each two adjacent pixel electrodes projected on the base substrate.

3. The array substrate according to claim 1, wherein each of the shielding electrodes comprises a transparent electrode; and in an area corresponding to a gap between each two adjacent pixel electrodes, two adjacent shielding electrodes are partially connected to each other and partially disconnected from each other, and an orthogonal projection of each shielding electrode projected on the base substrate partially overlaps with an orthogonal projection of the corresponding pixel electrode projected on the base substrate.

4. The array substrate according to claim 1, wherein the array substrate comprises a plurality of shielding electrodes, the shielding electrodes are arranged corresponding to the pixel electrodes, and the shielding electrodes disposed in an area corresponding to two adjacent pixel electrodes are electrically insulated from each other.

5. The array substrate according to claim 4, wherein on a plane where the second metal layer is located, along a direction perpendicular to the data line, an orthogonal projection of each shielding electrode projected on the base substrate is located within a boundary of an orthogonal projection of the corresponding pixel electrode projected on the base substrate.

6. The array substrate according to claim 1, further comprising a shielding electrode layer, wherein the shielding electrode layer is disposed between the second metal layer and the pixel electrode layer, and the shielding electrode layer comprises the plurality of shielding electrodes.

7. The array substrate according to claim 6, wherein a material of the shielding electrode comprises at least one of indium tin oxide, indium zinc oxide, or indium gallium zinc oxide.

8. The array substrate according to claim 1, wherein the first metal layer comprises a common line, an orthogonal projection of the common line projected on the base substrate is perpendicular to an orthogonal projection of each of the data lines projected on the base substrate, and the common line is connected to the shielding electrodes.

9. The array substrate according to claim 8, wherein an orthogonal projection of at least one shielding electrode projected on the base substrate overlaps with the orthogonal projection of the common line projected on the base substrate; and in an area where the orthogonal projection of the at least one shielding electrode projected on the base substrate overlaps with the orthogonal projection of the common line projected on the base substrate, the plurality of shielding electrodes are connected to the common line.

10. A liquid crystal display panel, comprising:
    an array substrate, a color filter substrate, and a liquid crystal layer disposed between the array substrate and the color filter substrate, wherein the array substrate comprises:
    a base substrate;
    a first metal layer disposed on one side of the base substrate;
    a second metal layer disposed at one side of the first metal layer away from the base substrate, the second metal layer comprising a plurality of data lines; and a pixel electrode layer disposed at one side of the second metal layer away from the first metal layer, the pixel electrode layer comprising a plurality of pixel electrodes;

wherein each of the pixel electrodes comprises a trunk electrode and a branch electrode, and the array substrate further comprises a plurality of shielding electrodes;

wherein each of the shielding electrodes is at least disposed between one of the data lines and one of the pixel electrodes, in which a portion of the trunk electrode of the pixel electrode extends along a direction of the data line, and on the base substrate, an orthogonal projection of the shielding electrode overlaps with an orthogonal projection of the portion of the trunk electrode extending along the direction of the data line, and an orthogonal projection of the data line overlaps with the orthogonal projection of the portion of the trunk electrode extending along the direction of the data line, wherein each of the shielding electrodes is a transparent shielding electrode.

11. The liquid crystal display panel according to claim 10, wherein an orthogonal projection of each shielding electrode projected on the base substrate covers orthogonal projections of each two adjacent pixel electrodes projected on the base substrate, and the orthogonal projection of each shielding electrode projected on the base substrate covers a gap between the orthogonal projections of each two adjacent pixel electrodes projected on the base substrate.

12. The liquid crystal display panel according to claim 10, wherein each of the shielding electrodes comprises a transparent electrode; and in an area corresponding to a gap between each two adjacent pixel electrodes, two adjacent shielding electrodes are partially connected to each other and partially disconnected from each other, and an orthogonal projection of each shielding electrode projected on the base substrate partially overlaps with an orthogonal projection of the corresponding pixel electrode projected on the base substrate.

13. The liquid crystal display panel according to claim 10, wherein the array substrate comprises a plurality of shielding electrodes, the shielding electrodes are arranged corresponding to the pixel electrodes, and the shielding electrodes disposed in an area corresponding to two adjacent pixel electrodes are electrically insulated from each other.

14. The liquid crystal display panel according to claim 13, wherein on a plane where the second metal layer is located, along a direction perpendicular to the data line, an orthogonal projection of each shielding electrode projected on the base substrate is located within a boundary of an orthogonal projection of the corresponding pixel electrode projected on the base substrate.

15. The liquid crystal display panel according to claim 10, wherein the array substrate further comprises a shielding electrode layer, the shielding electrode layer is disposed between the second metal layer and the pixel electrode layer, and the shielding electrode layer comprises the plurality of shielding electrodes.

16. The liquid crystal display panel according to claim 15, wherein a material of the shielding electrode comprises at least one of indium tin oxide, indium zinc oxide, or indium gallium zinc oxide.

17. The liquid crystal display panel according to claim 10, wherein the first metal layer comprises a common line, an orthogonal projection of the common line projected on the base substrate is perpendicular to an orthogonal projection of each of the data lines projected on the base substrate, and the common line is connected to the shielding electrodes.

18. The liquid crystal display panel according to claim 17, wherein an orthogonal projection of at least one shielding electrode projected on the base substrate overlaps with the orthogonal projection of the common line projected on the base substrate; and in an area where the orthogonal projection of the at least one shielding electrode projected on the base substrate overlaps with the orthogonal projection of the common line projected on the base substrate, the plurality of shielding electrodes are connected to the common line.

* * * * *